United States Patent
Suzuki et al.

(10) Patent No.: US 6,828,761 B1
(45) Date of Patent: Dec. 7, 2004

(54) BATTERY CHARGING/DISCHARGING APPARATUS AND BATTERY CHARGING/DISCHARGING METHOD

(75) Inventors: Mamoru Suzuki, Kanagawa (JP); Hideyuki Sato, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/658,931

(22) Filed: Sep. 9, 2003

Related U.S. Application Data

(62) Division of application No. 09/882,403, filed on Jun. 15, 2001.

(30) Foreign Application Priority Data

Jun. 16, 2000 (JP) ........................................ P2000-180675

(51) Int. Cl.[7] .............................. H02J 7/00; H02J 7/16
(52) U.S. Cl. ...................................... 320/132; 320/155
(58) Field of Search ................................ 320/132, 155; 324/427; 340/636.1, 7.32, 7.37, 7.38; 455/67.11, 67.7, 127.1, 127.5, 95, 226.1

(56) References Cited

U.S. PATENT DOCUMENTS 5,633,573 A * 5/1997 van Phuoc et al. ......... 320/128
6,236,214 B1 * 5/2001 Camp et al. ................ 324/427

* cited by examiner

*Primary Examiner*—Pia Tibbits
(74) *Attorney, Agent, or Firm*—Jay H. Maioli

(57) ABSTRACT

When a battery is in a standby mode, a microcomputer switches to a sleep mode when no charging/discharging current is supplied within a predetermined time and controls a timer to start measuring the standby time of the battery. When a charging/discharging current is supplied, the microcomputer switches to a wake-up mode and controls the timer to stop measuring the standby time. Then, the microcomputer reads the measured standby time. Based on the read standby time, the microcomputer calculates the correction value to correct the currently stored remaining battery capacity value.

4 Claims, 6 Drawing Sheets

BATTERY CHARGING/DISCHARGING APPARATUS AND BATTERY CHARGING/DISCHARGING METHOD

This is a division of prior application Ser. No. 09/882,403 filed Jun. 15, 2001.

BACKGROUND OF THE INVENTION

1. Field of the Invention

The present invention generally relates to a charging/discharging apparatus, and particularly to a battery charging/discharging apparatus and a battery charging/discharging method in which the remaining capacity of a battery can be determined with high accuracy.

2. Description of the Related Art

FIG. 1 is a block diagram showing an example structure of a conventional battery pack 1.

The battery pack 1 includes cells 12-1 and 12-2 connected in series (hereinafter collectively referred to as "battery 12", unless the cells 12-1 and 12-2 should be discriminated), which may comprise lithium ion batteries, for powering electronic devices. The positive electrode of the cell 12-1 is connected to a battery terminal 11-1 while the negative electrode of the cell 12-2 is connected to a battery terminal 11-2 via a resistor 13 provided for current detection and a protection device 14. When the battery pack 1 is attached to an electronic device (not shown), the battery terminals 11-1 and 11-2 are connected to connection terminals of the electronic device so that the electronic device can be powered by the battery 12.

A cell voltage detector 15 detects a cell voltage when the cell 12-1 and the cell 12-2 are connected in series, and outputs the detection result to a microcomputer 17. A charging/discharging current detector 16 detects the direction and value of voltage drop due to the current flowing to the resistor 13 in order to detect the existence of a charging current or a discharging current. The result is then output to the microcomputer 17. The protection device 14 protects the battery 12 from being overcharged or overdischarged.

The microcomputer 17 calculates the remaining battery capacity value based on the cell voltage supplied from the cell voltage detector 15, and stores the resulting value in an internal memory 17a. The microcomputer 17 switches to wake-up mode if a charging current or a discharging current is supplied from the charging/discharging current detector 16 or if it receives incoming data from the outside. If no charging/discharging current is supplied within a predetermined time or if no incoming data is received while it is in wake-up mode, the microcomputer 17 switches to sleep mode.

FIG. 2 is a flowchart of the process for calculating the remaining battery capacity value of the battery pack 1 shown in FIG. 1.

At step S1, the microcomputer 17 determines whether or not the battery 12 has been charged, i.e., whether or not a charging current has been supplied from the charging/discharging current detector 16. If it is determined at step S1 that the battery 12 has been charged, the process proceeds to step S2, in which the additional capacity value is calculated by equation (1) as follows;

$$\text{additional capacity value} = \text{charging current value} \times \text{sampling interval} \tag{1}$$

After the additional capacity value has been calculated at step S2, at step S3 the microcomputer 17 reads the remaining capacity value stored in the memory 17a, and calculates the up-to-date remaining capacity value by equation (2) as follows:

$$\text{up-to-date remaining capacity value} = \text{remaining capacity value read from the memory } 17a + \text{additional capacity value} \tag{2}$$

At step S3, the microcomputer 17 stores the up-to-date remaining capacity value calculated by equation (2) in the memory 17a or updates the existing remaining capacity value, and the process returns to step S1 to iterate the above-described operation.

If it is determined at step S1 that the battery 12 has not been charged, the process proceeds to step S4, in which the microcomputer 17 further determines whether or not the battery 12 has been discharged, i.e., whether or not a discharging current has been supplied from the charging/discharging current detector 16. If it is determined at step S4 that it has not been discharged, the process returns to step S1 to iterate the above-described operation.

If it is determined at step S4 that the battery 12 has been discharged, the process proceeds to step S5, in which the microcomputer 17 calculates the reduced capacity value by equation (3) as follows:

$$\text{reduced capacity value} = \text{discharging current value} \times \text{sampling interval} \tag{3}$$

After the reduced capacity value has been calculated at step S5, at step S6, the microcomputer 17 reads the remaining capacity value stored in the memory 17a, and calculates the up-to-date remaining capacity value by equation (4) as follows:

$$\text{up-to-date remaining capacity value} = \text{remaining capacity value read from the memory } 17a - \text{reduced capacity value} \tag{4}$$

At step S6, the microcomputer 17 stores the up-to-date remaining capacity value calculated by equation (4) in the memory 17a or updates the existing remaining capacity value, and the process returns to step S1 to iterate the above-described operation.

Accordingly, the calculation process using a charging current or a discharging current is performed to determine the remaining battery capacity.

The microcomputer 17 utilizes the power supplied from the battery 12 in order to determine the remaining battery capacity. Hence, when the battery is in standby mode (when the remaining battery capacity calculation process is not performed), the microcomputer 17 switches to sleep mode in order to reduce the power consumption of the microcomputer 17. This may suppress discharge current (leakage current) of the battery 12 in standby mode.

When the charging/discharging current detector 16 detects a charging current or a discharging current, the microcomputer 17 switches to wake-up mode; however, discharge current (leakage current) when the battery is in standby mode is minute, and thus cannot be detected by the charging/discharging current detector 16.

As a result, when the battery pack 1 is in standby mode, a trace amount of discharge current (leakage current) flows, but the accumulated current (standby current×standby time) cannot be measured or detected because the microcomputer 17 is in sleep mode. Therefore, if the battery pack 1 is in standby mode for a long time, there is a problem in that the remaining capacity value stored in the memory 17a by the microcomputer 17 might be relatively greater than the actual remaining capacity value (actual capacity value).

If the microcomputer 17 is forced not to enter sleep mode and is allowed to detect the standby current, the current will be minute, and will not be able to be precisely detected. There still exists such a problem that an error occurs between the remaining capacity value stored in the memory 17a and the actual capacity value.

SUMMARY OF THE INVENTION

Accordingly, it is an object of the present invention to provide a battery charging/discharging apparatus and a battery charging/discharging method in which the remaining battery capacity can be determined with high accuracy.

To this end, in one aspect of the present invention, a battery charging/discharging apparatus for determining the remaining capacity of a battery includes a measuring unit for measuring a standby time of the battery, a correction value calculating unit for calculating a correction value for the remaining capacity of the battery based on the standby time measured by the measuring unit, and a correcting unit for correcting a current remaining capacity value of the battery based on the correction value calculated by the correction value calculating unit.

The battery charging/discharging apparatus may further include a determining unit for determining whether or not the standby time has reached a predetermined time. The correction value calculating unit may calculate the correction value for the remaining capacity of the battery at a predetermined time interval based on the result of the determining unit.

According to the present invention, a battery charging/discharging method for determining the remaining capacity of a battery includes the steps of measuring a standby time of the battery, calculating a correction value for the remaining capacity of the battery based on the standby time measured in the measuring step, and correcting a current remaining capacity value of the battery based on the correction value calculated in the calculating step.

Accordingly, the correction value is calculated based on the standby time of the battery, and is used to correct currently stored remaining capacity value of the battery. This enables the remaining battery capacity to be determined with high accuracy.

In another aspect of the present invention, a battery charging/discharging apparatus for determining the remaining capacity of a battery includes a detecting unit for detecting a cell voltage, a reading unit for reading an appropriate remaining capacity value based on the cell voltage detected by the detecting unit, a comparing unit for comparing the appropriate remaining capacity value read by the reading unit with a currently stored remaining capacity value, and an updating unit for updating the currently stored remaining capacity value based on the result of the comparing unit.

The battery charging/discharging apparatus may further include a setting unit for setting the appropriate remaining capacity value that is suitable for the cell voltage.

According to the present invention, a battery charging/discharging method for determining the remaining capacity of a battery includes the steps of detecting a cell voltage, reading an appropriate remaining capacity value based on the cell voltage detected in the detecting step, comparing the appropriate remaining capacity value read in the reading step with a currently stored remaining capacity value, and updating the currently stored remaining capacity value based on the result in the comparing step.

Accordingly, based on the cell voltage which is detected, an appropriate remaining capacity value is read. The read remaining capacity value is then compared with a currently stored remaining capacity value to update the currently stored remaining capacity value based on the comparing result. This enables the remaining battery capacity to be determined at low cost with ease.

DESCRIPTION OF THE PREFERRED EMBODIMENT

Figure 1:
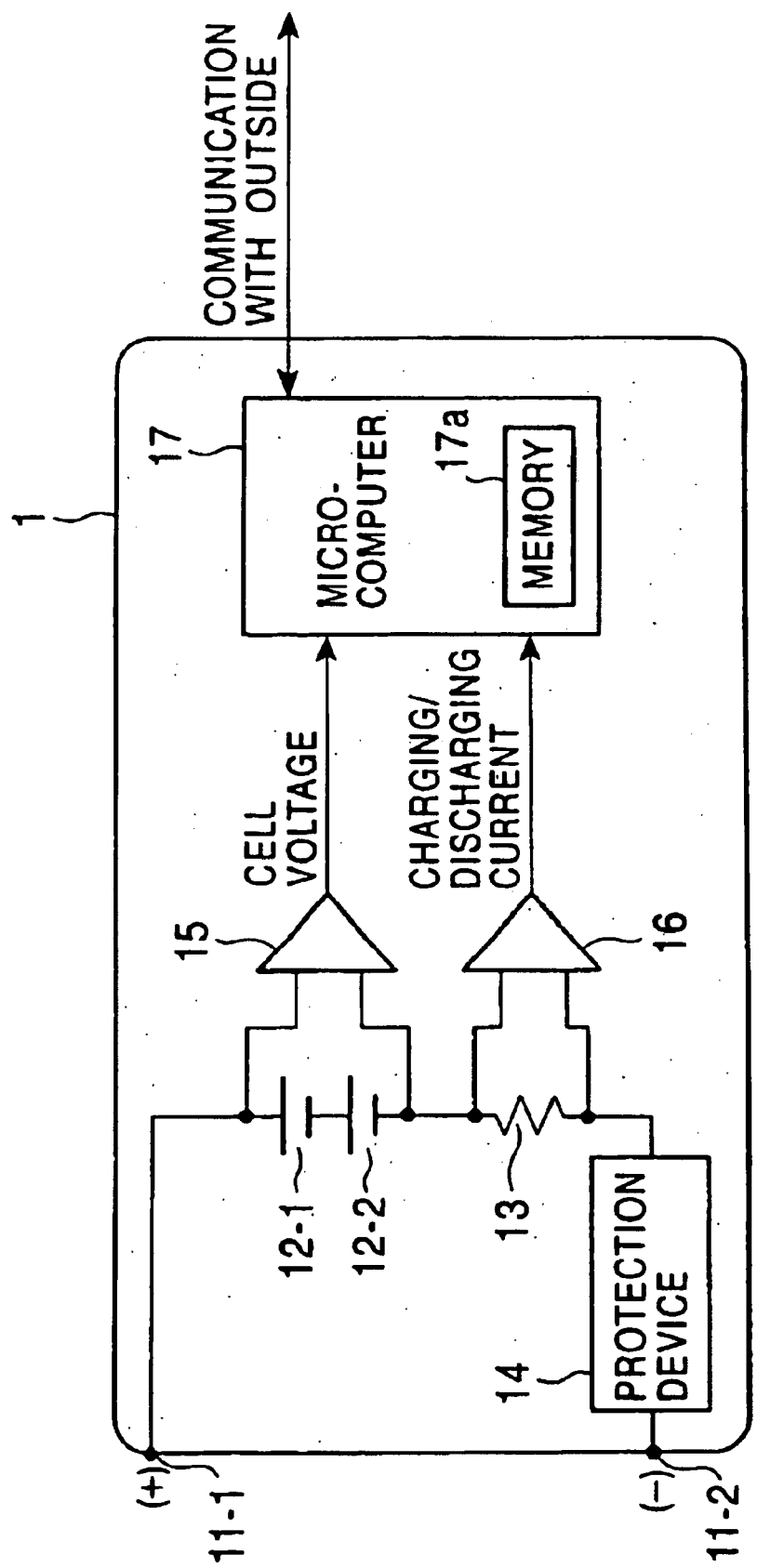
FIG. 1 is a block diagram showing an example structure of a conventional battery pack.
Figure 2:
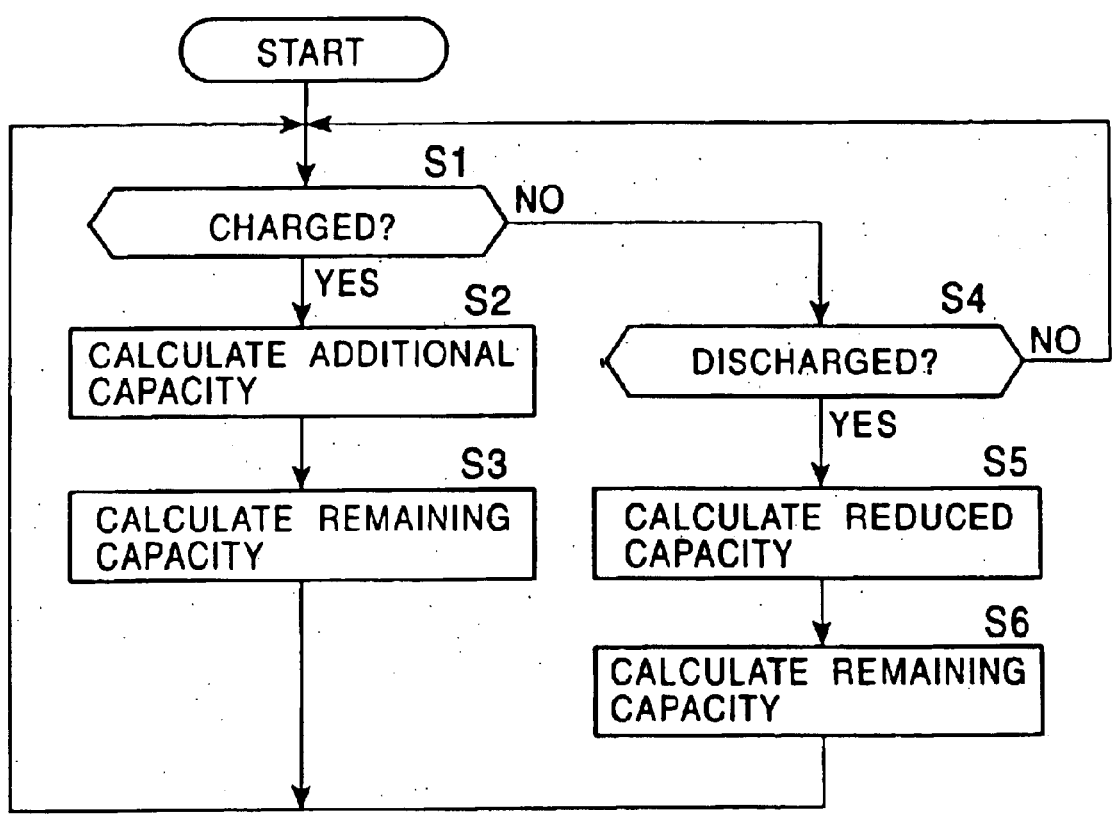
FIG. 2 is a flowchart of the process for calculating the remaining capacity of the battery pack shown in FIG. 1.
Figure 3:
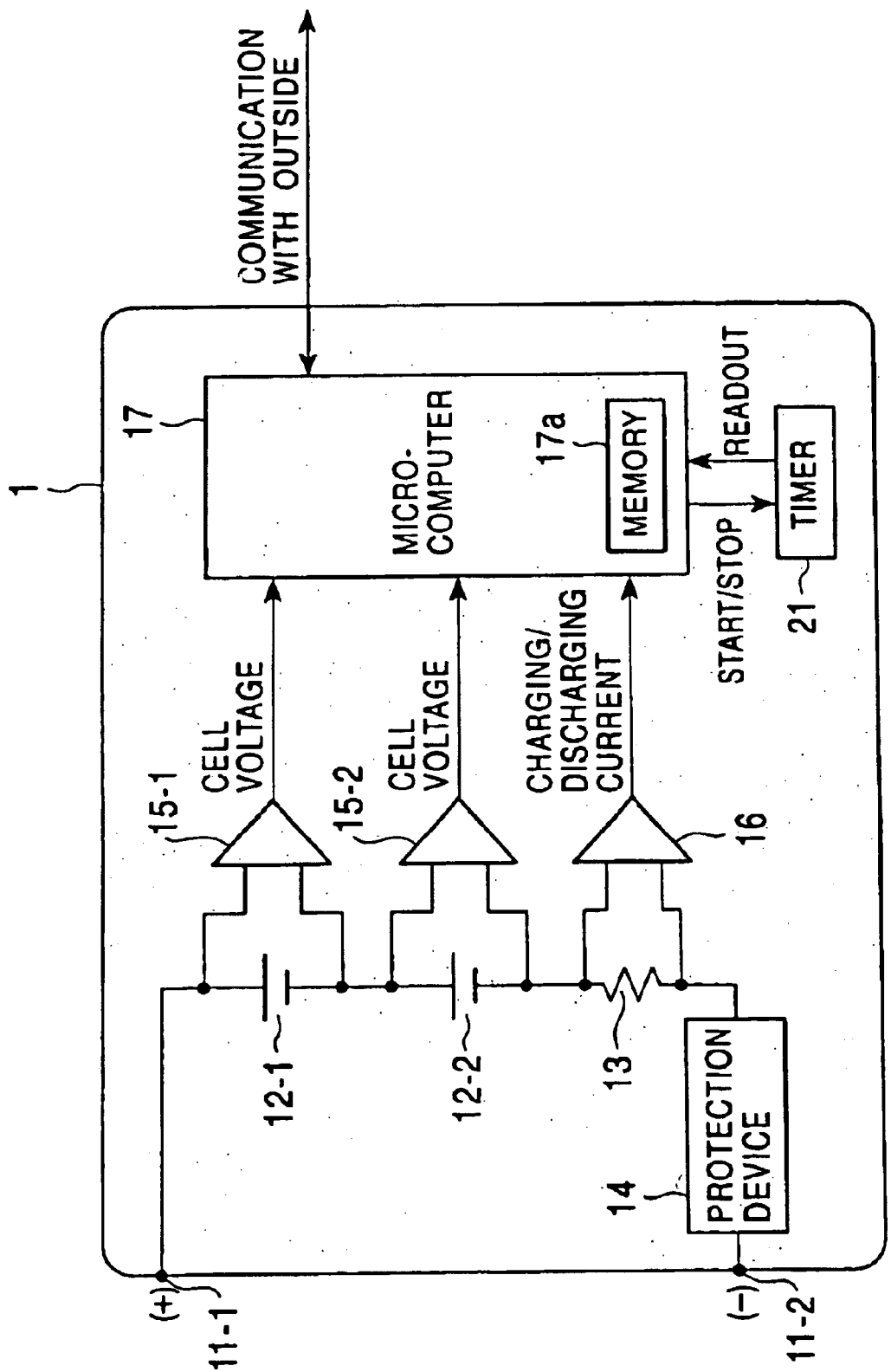
FIG. 3 is a block diagram of a battery pack according to one embodiment of the present invention.

FIG. 3 is a block diagram of a battery pack 1 according to one embodiment of the present invention. The same reference numerals are assigned to the parts corresponding to those in the conventional one shown in FIG. 1, and a description thereof is thus omitted as appropriate.

Referring to FIG. 3, the battery pack 1 includes cell voltage detectors 15-1 and 15-2 coupled to the cells 12-1 and 12-2, respectively, to detect cell voltages with higher accuracy, and further includes a timer 21. Other parts are constructed in the same manner as those in the conventional one shown in FIG. 1.

The cell voltage detector 15-1 detects the cell voltage of the cell 12-1, and outputs the detection result to the microcomputer 17. The cell voltage detector 15-2 detects the cell voltage of the cell 12-2, and outputs the detection result to the microcomputer 17.

The microcomputer 17 calculates the remaining battery capacity value based on the cell voltages supplied from the cell voltage detectors 15-1 and 15-2, and stores the resulting value in the internal memory 17a.

If no charging current or no discharging current is detected or supplied within a predetermined time, the microcomputer 17 switches to sleep mode. Then, the microcomputer 17 controls the timer 21 so as to start measuring the standby time. If a charging current or a discharging current is detected, the microcomputer 17 switches to wake-up mode. Then, the microcomputer 17 controls the timer 21 so as to stop measuring the standby time, and reads the measured standby time. Based on the standby time read, the microcomputer 17 calculates the correction value using a calculation process, as will be described, to correct the remaining battery capacity value.

In response to the instruction from the microcomputer 17, the timer 21 starts measuring the standby time. The timer 21 also stops measuring the standby time in response to the instruction of the microcomputer 17.

Figure 4:
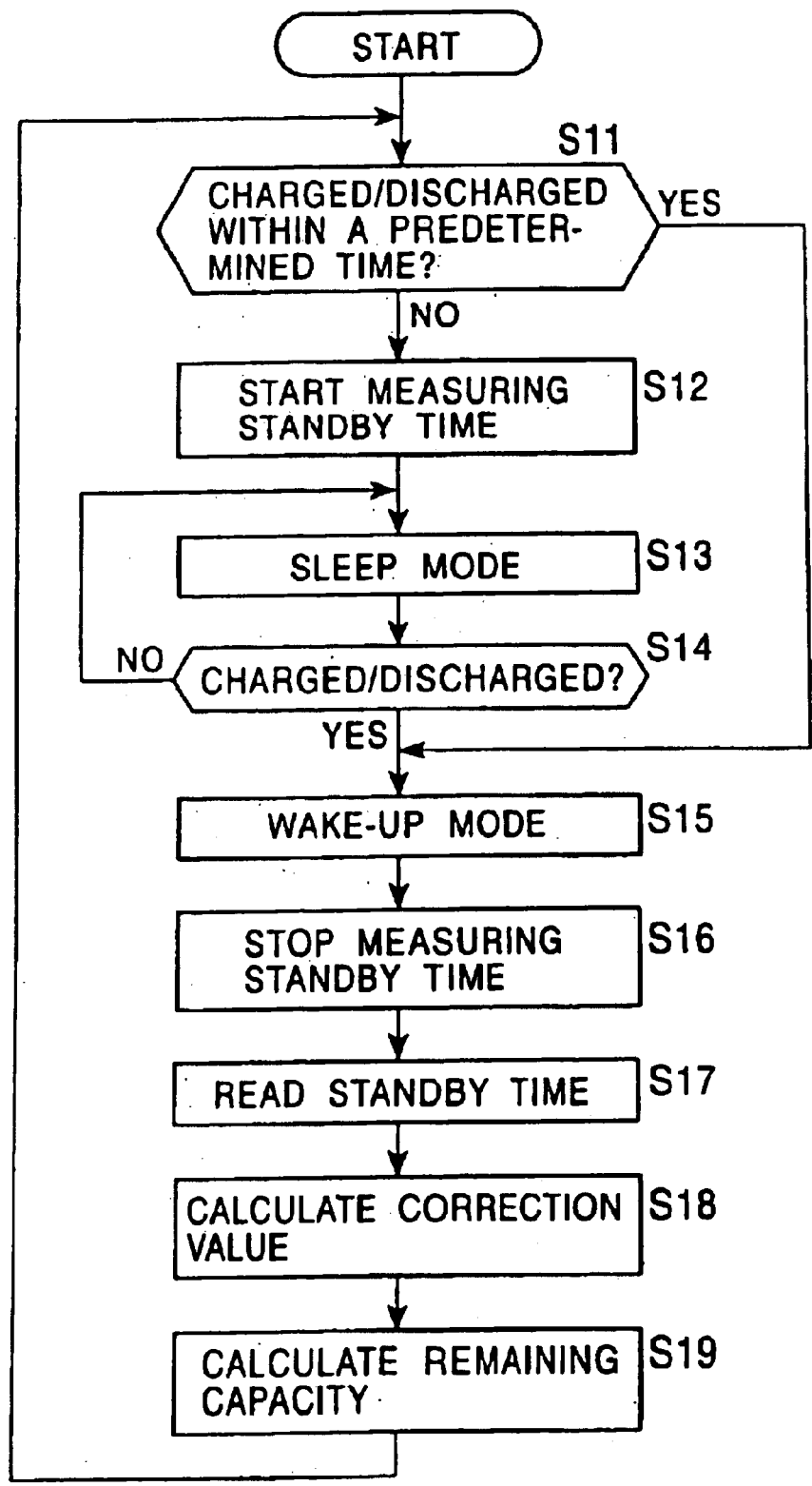
FIG. 4 is a flowchart of the process for correcting the remaining battery capacity value according to one embodiment of the present invention.

FIG. 4 is a flowchart of the process which is performed by the microcomputer 17 for correcting the remaining battery capacity value of the battery pack 1 shown in FIG. 3.

At step S11, the microcomputer 17 determines whether or not the battery 12 has been discharged or charged, i.e., whether or not a discharging current or a charging current has been detected by the charging/discharging current detector 16 within a predetermined time, e.g., 10 seconds. If it is determined at step S11 that the battery 12 has not been discharged or charged within the predetermined time, the process proceeds to step S12.

At steps S12 and S13, the microcomputer 17 controls the timer 21 so as to start measuring the standby time, before switching to sleep mode. At step S14, the microcomputer 17 determines whether or not the battery 12 has been discharged or charged, i.e., whether or not a discharging current or a charging current has been detected by the charging/discharging current detector 16. If it is determined at step S14 that the battery 12 has not been discharged or charged, the process returns to step S13, in which the microcomputer 17 waits while it remains in sleep mode. If it is determined at step S14 that the battery 12 has been discharged or charged, the process proceeds to step S15.

Following step S14, or if it is determined at step S11 that the battery 12 has been charged or discharged within the predetermined time, the microcomputer 17 switches to wake-up mode at step S15. At steps S16 and S17, the microcomputer 17 controls the timer 21 so as to stop measuring the standby time, and reads the measured standby time. The microcomputer 17 then resets the timer 21.

At step S18, the microcomputer 17 calculates the correction value from the standby time read at step S17 by equation (5) as follows:

$$\text{correction value} = (\text{standby current value} + \text{battery self-discharge current value}) \times \text{standby time} \quad (5)$$

where the standby current and the self-discharge current which flow per unit time are measured in advance and stored in the memory 17a.

Following step S18, at step S19, the microcomputer 17 reads the remaining capacity value stored in the memory 17a, and calculates the up-to-date remaining capacity value by equation (6) as follows.

$$\text{up-to-date remaining capacity value} = \text{remaining capacity value read from the memory } 17a - \text{correction value} \quad (6)$$

At step S19, the microcomputer 17 stores the up-to-date remaining capacity value calculated by equation (6) in the memory 17a or updates the existing remaining capacity value, and the process returns to step S11 to iterate the above-described operation.

The standby current, the battery self-discharge current, and the standby time are used to calculate the correction value in this way, and the remaining battery capacity can therefore be corrected with high accuracy.

However, if an overflow of the timer 21 occurs during the process for correcting the remaining battery capacity value according to the flowchart illustrated in FIG. 4, an accurate correction of the remaining battery capacity value may not be performed from the time point of the overflow.

In order to address this circumstance, the correction process is performed at fixed time intervals while the microcomputer 17 is in wake-up mode, thus the remaining battery capacity value can be more accurately corrected.

Figure 5:
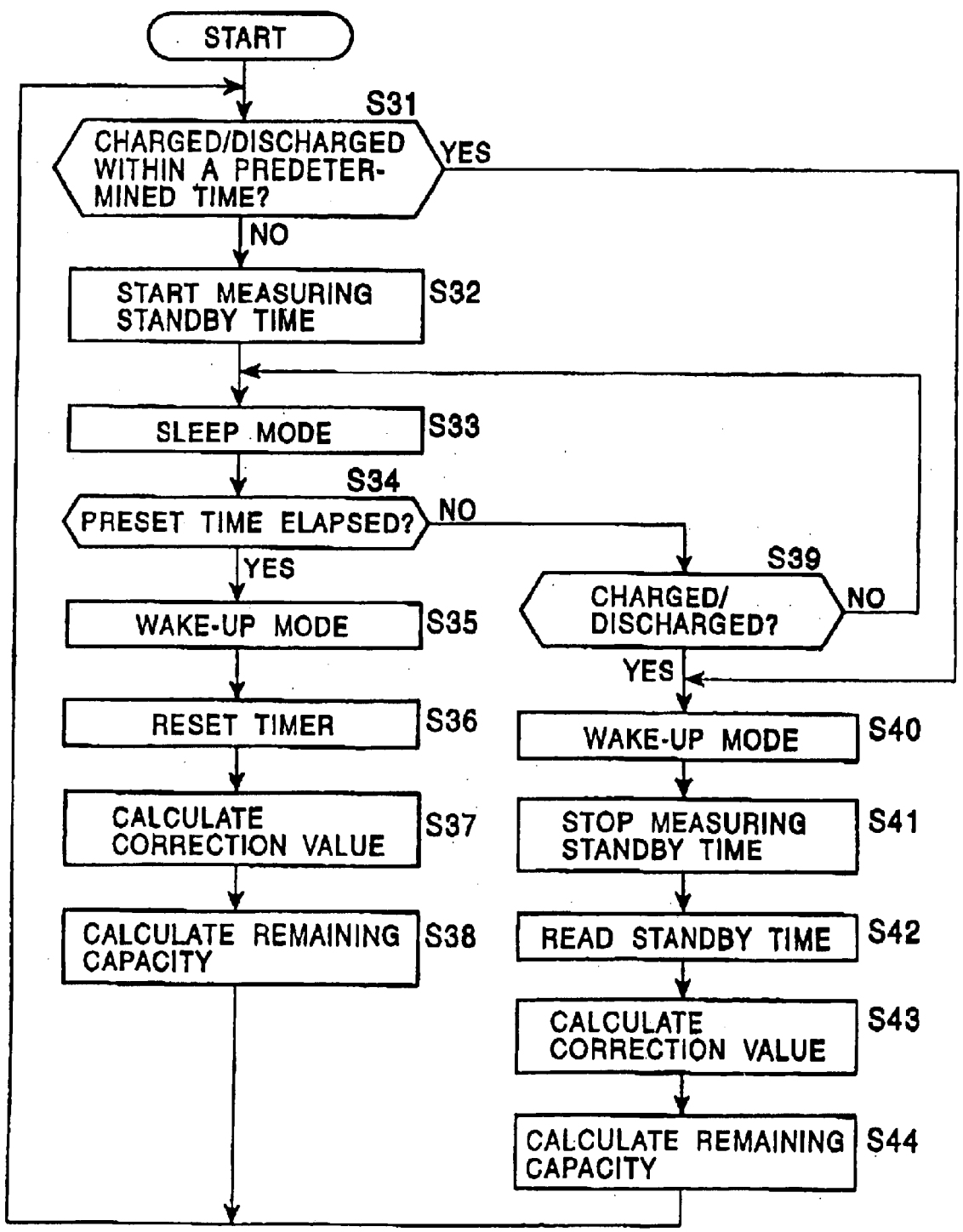
FIG. 5 is a flowchart of the process for correcting the remaining battery capacity value according to a modification of the embodiment of the present invention.

FIG. 5 is a flowchart of the process for correcting the remaining battery capacity value according to a modification of the embodiment of the present invention, in which the remaining battery capacity value is corrected at a fixed time interval.

At step S31, the microcomputer 17 determines whether or not the battery 12 has been discharged or charged within a predetermined time. If it is determined at step S31 that it has not been discharged or charged within the predetermined time, the process proceeds to step S32.

At steps S32 and S33, the microcomputer 17 controls the timer 21 so as to start measuring the standby time, before switching to sleep mode. At step S34, the microcomputer 17 determines whether or not a preset time has elapsed. The period in which an overflow does not occur is set in advance as the preset time, and when the preset time has elapsed, the timer 21 notifies the microcomputer 17 of the elapse of the preset time. That is, the microcomputer 17 determines whether or not it receives a command from the timer 21 indicating that the preset time has elapsed.

If it is determined at step S34 that the preset time has elapsed, the process proceeds to step S35, in which the microcomputer 17 switches to wake-up mode in response to the command from the timer 21. At step S36, the microcomputer 17 resets the timer 21.

At steps S37 and S38, the microcomputer 17 calculates the correction value from equation (5), and further calculates the up-to-date remaining capacity value from equation (6). Then, the microcomputer 17 stores the up-to-date remaining capacity value in the memory 17a or updates the existing remaining capacity value, and the process returns to step S31 to iterate the above-described operation.

If it is determined at step S31 that the battery 12 has been discharged or charged within the predetermined time, or if it is determined at step S14 that the preset time has not elapsed, the process proceeds to step S39.

The operation at steps S39 to S44 is the same as that of steps S14 to S19 as previously described with reference to FIG. 4, and a description thereof is thus omitted.

Accordingly, the standby current, the battery self-discharge current, and the standby time are used to calculate the correction value at fixed time intervals, thus the remaining battery capacity may be corrected with high accuracy even when the battery pack 1 is in standby mode for a long time.

Now, the operation for calculating the correction value of the remaining battery capacity is described using specific values as an example.

If the standby current which flows when the battery pack 1 is in standby mode is 40 $\mu$A, the self-discharge current is 10 $\mu$A, and the standby time is 100 hours, then the correction value is found as follows from equation (5):

$$\text{correction value} = (40\ \mu A + 10\ \mu A) \times 100\ h = 5000\ \mu Ah = 5\ mAh.$$

If the correction value is calculated taking an overflow of the timer 21 into consideration, and when the correction process is performed, for example, at an interval of 20 hours, then the correction value is found as follows from equation (5):

$$\text{correction value} = (40\ \mu A + 10\ \mu A) \times 20\ h = 1000\ \mu Ah = 1 mAh.$$

This enables the remaining battery capacity value to be corrected with high accuracy even if the battery pack 1 is in standby mode for a long time.

As described above, the timer 21 is used to measure the standby time, and the remaining battery capacity value is corrected based on the resulting standby time. Instead, cell voltages may be detected to correct the remaining battery capacity value at low cost with ease although the correction accuracy is not higher than that when an additional timer is provided.

Figure 6:
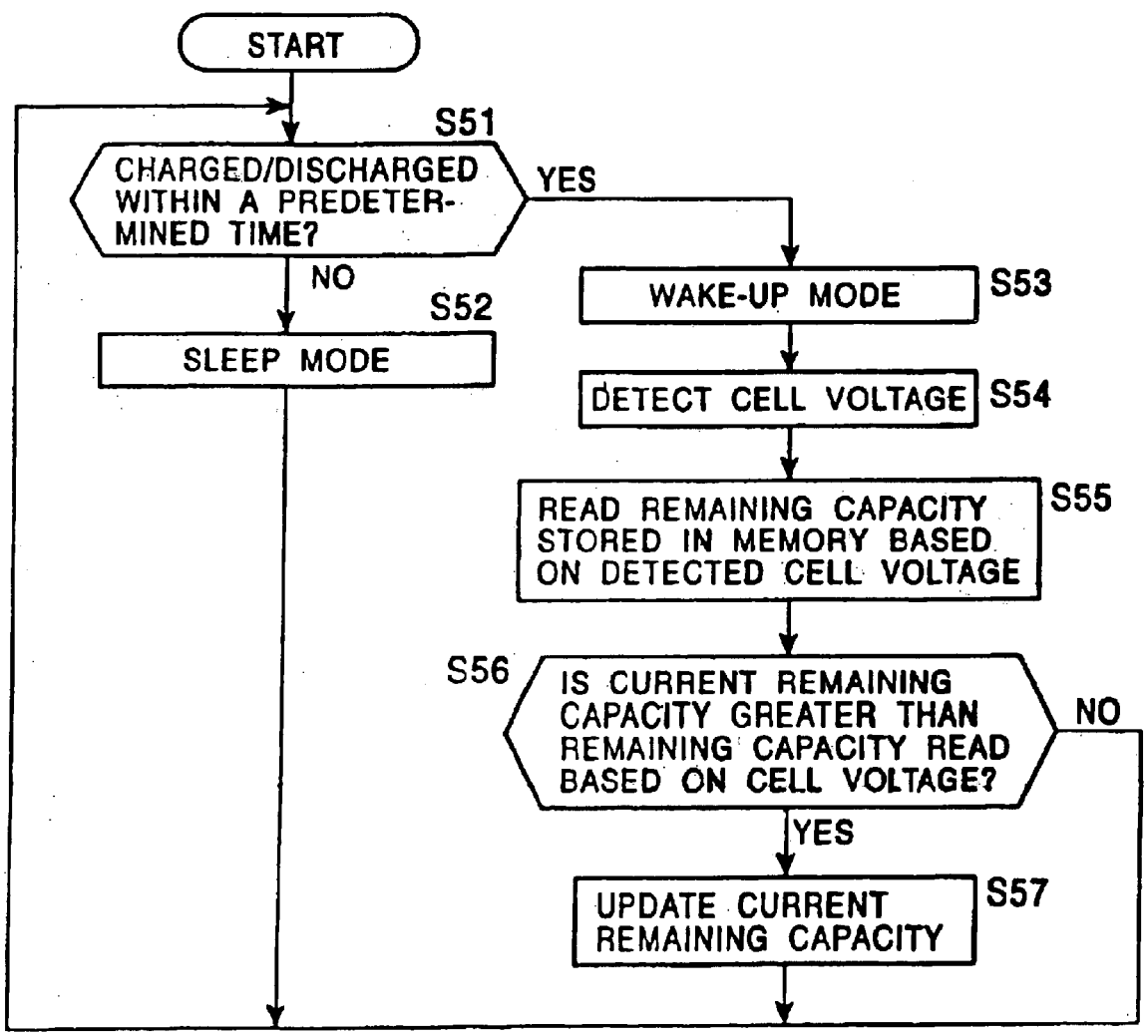
FIG. 6 is a flowchart of the process for correcting the remaining battery capacity value according to another modification of the embodiment of the present invention.

FIG. 6 is a flowchart of the process for correcting the remaining battery capacity value according to another modification of the embodiment of the present invention, in which the remaining battery capacity value is corrected based on cell voltages.

At step S51, the microcomputer 17 determines whether or not the battery 12 has been discharged or charged within a predetermined time. If it is determined at step S51 that it has not been discharged or charged within the predetermined time, the process proceeds to step S52, in which the microcomputer 17 switches to sleep mode.

If it is determined at step S51 that the battery 12 has been discharged or charged, the process proceeds to step S53, in which the microcomputer 17 switches to wake-up mode. At step S54, the microcomputer 17 detects the cell voltages supplied by the cell voltage detectors 15-1 and 15-2.

At step S55, the microcomputer 17 reads appropriate remaining capacity value from the memory 17a based on the cell voltages detected at step S54. In this case, the remaining battery capacity value suitable for each cell voltage is set and is stored in the memory 17a.

At step S56, the microcomputer 17 reads the current remaining capacity value stored in the memory 17a, and determines whether or not it is greater than the remaining capacity value which is read based on the cell voltages at step S55.

If it is determined at step S56 that the current remaining capacity value stored in the memory 17a is greater than the remaining capacity value which is read based on the cell voltages, the process proceeds step S57, in which the microcomputer 17 stores the remaining capacity value which is read based on the cell voltages as the current remaining capacity value in the memory 17a or updates the current remaining capacity value. Then, the process returns to step S51 to iterate the above-described operation.

If it is determined at step S56 that the current remaining capacity value stored in the memory 17a is not greater than, i.e., equal to, the remaining capacity value which is read based on the cell voltages, the process skips step S57 (without updating the current remaining capacity value) back to step S51 to iterate the above-described operation.

Accordingly, if it is determined that the remaining capacity value is not appropriate, the current remaining capacity value is updated with the remaining capacity value which is read based on the cell voltages. This allows significant deviations of the remaining capacity value to be corrected even when no timer is used.

What is claimed is:

1. A battery charging/discharging apparatus for determining a remaining capacity of a battery, comprising:

measuring means for measuring a standby time during which the battery is in a standby mode;

correction value calculating means for calculating a correction value for the remaining capacity of the battery based on the standby time measured by said measuring means;

correcting means for correcting a present remaining capacity value of the battery based on the correction value calculated by said correction value calculating means; and determining means for determining whether the standby time has reached a predetermined time, wherein said correction value calculating means calculates the correction value for the remaining capacity of the battery at a predetermined time interval based on a result of said determining means.

2. A battery charging/discharging method of a battery charging/discharging apparatus for determining a remaining capacity of a battery, said battery charging/discharging method comprising the steps of:

measuring a standby time during which the battery is in a standby mode;

calculating a correction value for the remaining capacity of the battery based on the standby time measured in the measuring step;

correcting a present remaining capacity value of the battery based on the correction value calculated in the calculating step; and determining whether the standby time has reached a predetermined time, wherein said step of calculating a correction value calculates the correction value for the remaining capacity of the battery at a predetermined time interval based on a result of said determining step.

3. Apparatus for determining a remaining capacity of a battery, the apparatus comprising:

a cell voltage detector for detecting a cell voltage;

a microcomputer for calculating a remaining battery capacity value based on a detected cell voltage from the cell voltage detector;

a memory for storing the remaining battery capacity value calculated by the microcomputer; and a timer under control of the microcomputer for counting time, wherein when the microcomputer determines that the battery has been in a charge/discharge mode within a predetermined time as counted by the timer the cell voltage is detected by the cell voltage detector and the remaining battery capacity is read out from the memory and compared by the microcomputer with the newly detected cell voltage and when the remaining battery capacity value is greater, the newly detected cell voltage is used as an up-to-date remaining battery capacity value that is then stored in the memory.

4. A method employing a microcomputer for determining a remaining capacity of a battery, the method comprising the steps of:

detecting a battery voltage and storing the detected voltage as a remaining battery capacity value in a memory of the microcomputer;

determining whether the battery has not been in a charge/discharge mode within a predetermined period of time as counted by a timer;

upon a determination in the step of determining that the battery has been in the charge/discharge mode within the predetermined period of time, newly detecting the battery voltage;

reading the remaining battery capacity value from the memory;

comparing the read-out remaining battery capacity value with the newly detected battery voltage;

upon a comparison result that the read-out remaining battery capacity value is greater, using the newly detected battery voltage as an updated remaining battery capacity vale; and replacing the remaining battery capacity value stored in the memory with the updated remaining battery capacity value.

* * * * *